United States Patent
May et al.

(10) Patent No.: US 9,190,957 B2
(45) Date of Patent: Nov. 17, 2015

(54) EFFICIENT DUAL CHANNEL CONVERSION IN A MULTI-BAND RADIO RECEIVER

(71) Applicant: Silicon Laboratories Inc., Austin, TX (US)

(72) Inventors: Mark May, Austin, TX (US); Carlos Briseno-Vidrios, College Station, TX (US); Junsong Li, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 148 days.

(21) Appl. No.: 13/920,726

(22) Filed: Jun. 18, 2013

(65) Prior Publication Data

US 2014/0370832 A1    Dec. 18, 2014

(51) Int. Cl.
*H04B 1/06* (2006.01)
*H03D 7/16* (2006.01)

(52) U.S. Cl.
CPC ..................................... *H03D 7/166* (2013.01)

(58) Field of Classification Search
USPC ............... 455/132, 140, 142, 143, 323, 137
See application file for complete search history.

(56) References Cited

U.S. PATENT DOCUMENTS

| | | | |
|---|---|---|---|
| 8,027,652 B2* | 9/2011 | Gilbert | 455/142 |
| 8,032,090 B2 | 10/2011 | Piovaccari et al. | |
| 8,290,457 B2 | 10/2012 | Li | |
| 8,542,775 B2* | 9/2013 | Volnhals | 375/316 |
| 2005/0215213 A1* | 9/2005 | Toporski | 455/190.1 |
| 2006/0025103 A1* | 2/2006 | Iancu | 455/337 |
| 2008/0298515 A1* | 12/2008 | Peyla et al. | 375/343 |
| 2010/0265398 A1* | 10/2010 | Johnson et al. | 348/500 |
| 2012/0157031 A1 | 6/2012 | Strickland et al. | |

OTHER PUBLICATIONS

U.S. Appl. No. 13/905,954, filed May 30, 2013, entitled "Radio Receiver Having Enhanced Automatic Gain Control Circuitry," by Mark May.
U.S. Appl. No. 13/527,941, filed Jun. 20, 2012, entitled "Controlling Filter Bandwidth Based on Blocking Signals," by Junsong Li.

* cited by examiner

Primary Examiner — Blane J Jackson
(74) Attorney, Agent, or Firm — Trop, Pruner & Hu, P.C.

(57) ABSTRACT

In an embodiment, an apparatus includes a first signal path to receive and process a radio frequency (RF) signal of a first band and which has a first programmable digitizer to convert the RF signal of the first band into a digitized signal without downconversion. In addition, the apparatus further includes a second signal path to receive and process an RF signal of a second band, where at least portions of one or more of the paths may be shared during operation in the different bands.

20 Claims, 9 Drawing Sheets

EFFICIENT DUAL CHANNEL CONVERSION IN A MULTI-BAND RADIO RECEIVER

BACKGROUND

Many different types of radio receivers exist. Some receivers are configured for operation only at a single band while other receivers are configured as multi-band receivers. For example, familiar car and other radio receivers are often implemented as an AM/FM receiver in addition to possibly other bands. In some cases each band is configured as a separate receiver. However in doing so increased component counts, size, complexity, cost and power consumption occur. Thus many receivers implement some fashion of sharing of components between the different bands.

One type of known sharing is to provide parallel signal processing paths for the different bands for at least part of the processing and then share other components between the bands. For example, it is common to share back end processing such as digital processing and so forth. Furthermore, some receivers provide for shared digitizers such as analog-to-digital converters (ADCs) that are fixed to operate at a bandwidth set by the largest channel bandwidth in the supported radio bands. While this enables reuse, certain difficulties are present in that many components in front of this digitizer are not shared. For example, independent mixers are present for the different signal paths, which can cause interference and noise originating from mixer artifacts and harmonics of a mixing signal. As to the ADC, by configuring it to operate at a higher bandwidth for this largest bandwidth, an increase in converter performance is needed. This increased performance is very expensive in terms of current, die size, digital filtering, and so forth.

SUMMARY OF THE INVENTION

According to one aspect, an apparatus includes a first signal path to receive and process a radio frequency (RF) signal of a first band and which has a first programmable digitizer to convert the RF signal of the first band into a digitized signal without downconversion to a lower frequency signal and a second programmable digitizer to convert a second RF signal of the first band into a second digitized signal without downconversion to a lower frequency signal. The apparatus may further include a second signal path to receive and process a RF signal of a second band and which has at least one mixer to downconvert the RF signal of the second band to a second frequency signal, wherein the second signal path is to reuse the first programmable digitizer to digitize the second frequency signal into a third digitized signal.

In an embodiment, the first signal path further includes a first front end circuit, a first low noise amplifier (LNA), and first and second variable gain amplifiers (VGAs), where an output of the first VGA is coupled to the first programmable digitizer and an output of the second VGA is coupled to the second programmable digitizer. In turn, the second signal path further includes a second front end circuit and a second LNA having an output coupled to the at least one mixer of the second signal path, where an output of the at least one mixer is coupled to the first and second VGAs.

A digital signal processor (DSP) may be coupled to the first and second programmable digitizers to receive and process the first and second digitized signals. This DSP may demodulate the first digitized signal to output a demodulated signal corresponding to a desired signal channel and to scan the second digitized signal for one or more valid channels and to populate a table with the one or more valid channels.

The DSP may further include a selector to receive the first and second digitized signals and to provide the second digitized signal to a first digital signal path including at least one filter and to provide the first digitized signal to a second digital signal path including at least one filter, a demodulator, and an audio processor.

Another aspect is directed to a radio receiver having a first signal path to receive and process a RF signal of an AM band. This path may include: a first branch having a first digitizer controllable to digitize a first portion of the AM band of the RF signal including a desired signal channel and a second branch having a second digitizer controllable to digitize another portion of the AM band of the RF signal while the first digitizer digitizes the first portion of the AM band. In turn, a second signal path may receive and process a RF signal of an FM band and includes a mixer to downconvert the RF signal of the FM band to a second frequency signal, where the second signal path is to provide the second frequency signal to the first and second digitizers to digitize the second frequency signal.

The first digitizer may be controllable to operate as a low pass analog-to-digital converter (ADC) when the desired signal channel is within the first portion of the AM band and controllable to operate as a bandpass ADC when the desired channel is within a second portion of the AM band. This second AM band portion may be of a higher frequency than the first portion of the AM band. In an embodiment, the first digitizer is controllable to operate at a first bandwidth to digitize the desired signal channel located in the first portion of the AM band and the second digitizer is concurrently controllable to operate at a second bandwidth to digitize a second signal channel located in the another portion of the AM band.

In turn, a controller is coupled to configure the first and second digitizers to operate at the first and second bandwidths, respectively, in an AM mode, and to configure each of the first and second digitizers to operate at a third bandwidth in an FM mode. The first and second digitizers are controllable to operate at a low pass mode to digitize a complex intermediate frequency (IF) signal in an FM mode.

In another aspect, a method includes: receiving a request for a desired signal channel in a first band in a controller of a radio receiver and configuring a first ADC of the radio receiver to operate at a first bandwidth to digitize the desired signal channel without downconversion to a lower frequency signal. The method may further include configuring a second ADC of the radio receiver to operate at second bandwidth to digitize a second portion of the first band without downconversion.

Still further, the method includes receiving a first RF signal in the first ADC and receiving a second radio signal in the second ADC and digitizing the first RF signal into a first digitized signal in the first ADC and digitizing the second RF signal into a second digitized signal in the second ADC. The first digitized signal may then be received in a DSP of the radio receiver and demodulated to obtain a demodulated signal for the desired signal channel.

In an embodiment, the method includes performing a scan of at least a portion of the first band using the second digitized signal to determine presence of one or more valid channels in the second portion of the first band, and storing information associated with the one or more valid channels in a table of the radio receiver, where the first band is an AM band.

DETAILED DESCRIPTION

In various embodiments, partial independent receiver paths and a partial common or shared path may be provided for different bands of a radio receiver. In this way, requirements for digitization circuitry implemented in the partial shared path for the different bands can be met in a manner that reduces area and power consumption of the receiver. Embodiments may also repurpose unused hardware of one or more of these paths to perform background scan operations.

Figure 1:
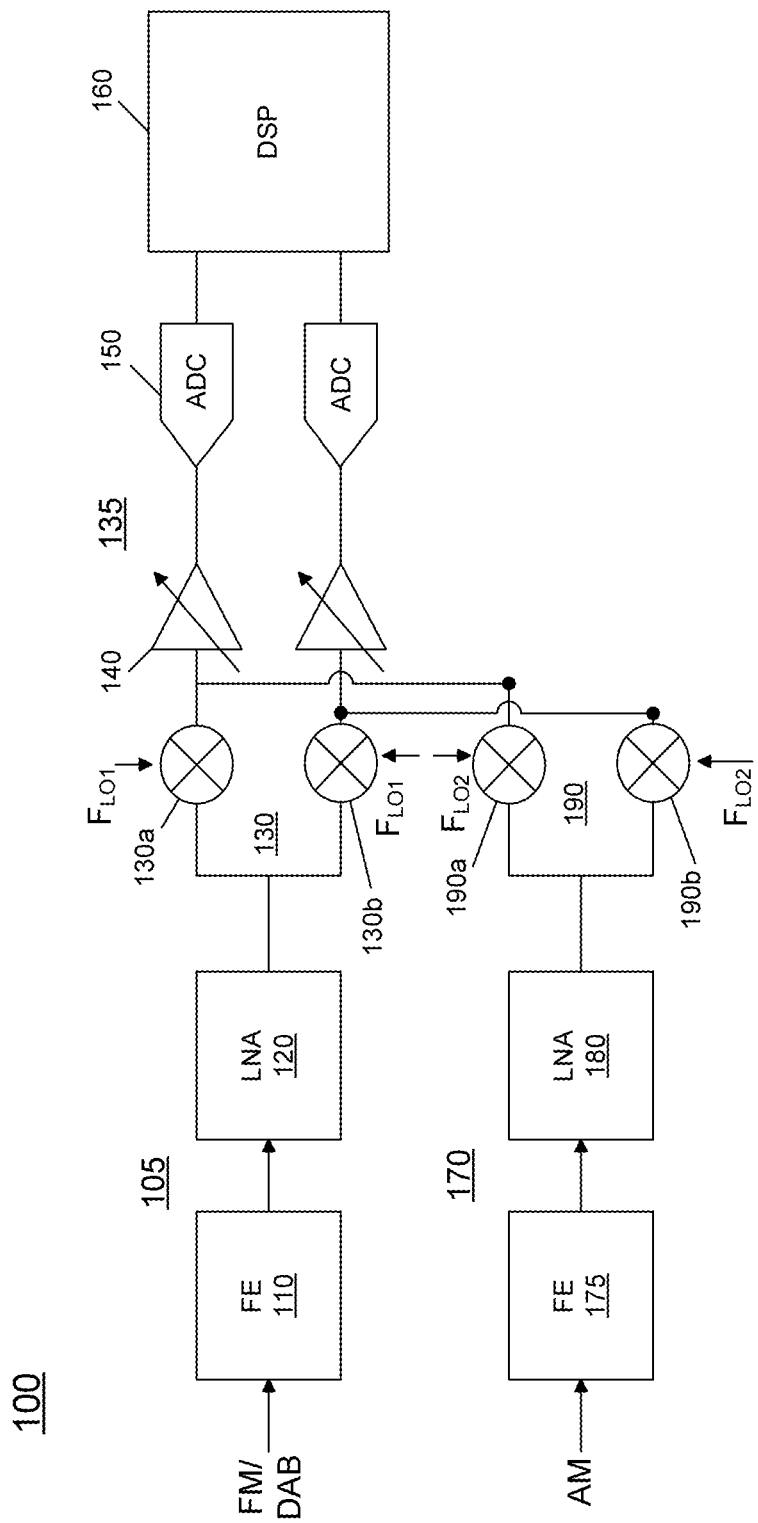
FIG. 1 is a block diagram of a typical radio receiver used for receiving and processing radio frequency (RF) signals of different bands.

Referring first to FIG. 1, illustrated is a block diagram of a typical radio receiver used for receiving and processing radio frequency (RF) signals of different bands. As used herein, the term "RF signal" refers to a signal having a frequency within a range of about 100 kilohertz (kHz) to several gigahertz. For example, medium wave radio frequency signals (AM radio signals) are within a range of approximately 520 kHz to 1.71 MHz. Within AM radio signals, the signal content is contained within the amplitude of the signal, which strength can be used to specify the sounds to be reproduced by a speaker, for example.

In the embodiment of FIG. 1, receiver 100 includes independent front end processing paths for the different bands. These paths may be dedicated to a particular band or multiple bands may utilize a common path as appropriate. Specifically as seen in FIG. 1, receiver 100 includes a first front end path 105 including front end circuitry 110 that is configured to receive incoming RF signals of a FM band or a digital audio broadcasting (DAB) band. As examples, this front end circuitry may include one or more attenuators, filters and other circuitry. The resulting front end processed signals are provided to a low noise amplifier (LNA) 120 that amplifies the incoming RF signal and provides it to mixer circuitry. In the embodiment shown, dual real mixers $130_a$ and $130_b$ may be clocked in quadrature to effect a single complex mixer 130 that receives the appropriately amplified RF signal and downconverts it to a lower frequency, which in embodiments may be an intermediate frequency (IF). In turn, the downconverted signals are provided to a common path 135 for further processing.

Specifically in FIG. 1 common path 135 includes gain control circuitry, namely variable gain amplifiers (VGAs) 140 and digitization circuitry 150, namely analog-to-digital converters (ADCs). The resulting digitized signals are then provided to digital circuitry, namely a digital signal processor (DSP) 160, for further processing including demodulation. From there, the demodulated signals may be provided to other portions of a system. For example, digitally demodulated signals may be provided to another converter (not shown in FIG. 1) for conversion to analog audio signals for playback on a desired output device.

Still referring to FIG. 1, at least portions of this receiver circuitry, namely common path 135, can be leveraged for other bands. For front end processing of other bands before this common path, independent front end paths may be provided. Thus in the context of FIG. 1 a separate front end processing path 170 is provided for AM signals. As seen, this path includes independent front end circuitry 175 and an independent LNA 180. In addition, an independent complex mixer 190 formed of dual real mixers $190_a$ and $190_b$, which downconverts these AM signals to a lower frequency, e.g., an appropriate IF frequency.

For further processing, mixer 190 couples to the remainder of the downstream circuitry of common path 135 described above. Yet in this type of implementation there are difficulties that use of the complex mixer for the AM band raises. These issues include image rejection calibration in the DSP (e.g., requiring many MIPs); LO harmonics downconvert channels near odd harmonics on top of a desired channel; there is no support for simultaneous decoding of two AM channels since the bandwidth of the ADC is less than the width of the AM band; and generation of LO clocks and RF interference may increase noise and power consumption.

Thus according to an embodiment, one or more bands may be processed in a receiver without the downmixing performed by a mixer. More specifically for a multi-band tuner including an AM receiver, embodiments may eliminate a mixer for the AM path. Instead, incoming RF signals can be processed in a receiver signal processing path and be directly converted to digital form in a digitizer, avoiding the need for downconversion to a lower frequency signal by a mixer. As such, the above issues regarding noise, interference, size, power consumption and so forth all can be avoided.

Furthermore, to enable improved processing for signals of all bands, a configurable digitizer such as an ADC may be provided. This configurable or programmable ADC may be operated at a controllable bandwidth based on a desired signal channel. This is so both in AM mode and modes for other bands. In an AM mode, although the incoming signal to the ADC may be within a bandwidth of approximately 1.7 Megahertz, a desired channel may only occupy approximately 10 kHz. By programming the ADC to operate at an appropriate bandwidth based on the desired channel, the desired channel can be effectively digitized and provided to digital circuitry such as a DSP for demodulation and further processing, without the need for increasing ADC bandwidth to convert the entire AM band.

Figure 2:
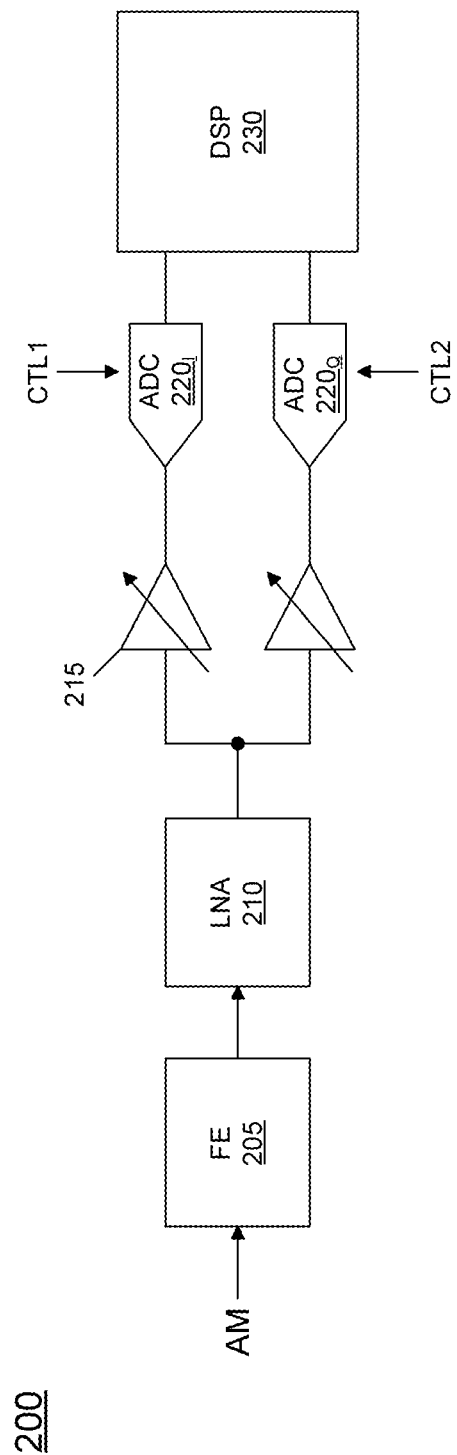
FIG. 2 is a block diagram of a portion of a radio receiver in accordance with an embodiment.

Referring now to FIG. 2, shown is a block diagram of a portion of a radio receiver in accordance with an embodiment. The radio receiver may be implemented as an integrated circuit (IC) including a single semiconductor die and having an input terminal such as an input pin of the IC to receive an RF signal. Although a single path 200 (namely an AM signal path) is shown in FIG. 2 for ease of illustration understand that in many implementations a radio receiver may be a multi-band receiver configured to receive various bands of communication. For example, a combined receiver may be configured to handle incoming AM signals, FM signals, DAB signals and short wave signals. Thus depending upon a band of a desired channel, the receiver may be configured to operate in a given mode. Furthermore, understand that various reuse of components may be realized to reduce overall size and power consumption of a receiver by reusing components as appropriate for handling signals of different bands.

As described herein, digitization circuitry, e.g., ADCs, may be shared between the multiple paths. Furthermore, downstream digital circuitry such as a DSP, a dedicated demodulator or other digital circuitry may similarly be used for the different modes of operation. Still further in some implementations at least portions of an analog front end of the receiver may also be reused in multiple modes. However, for purposes of the AM path, note that a front end of path 200 may be dedicated for use with AM signals, although portions of the signal processing path may be shared for use in multiple modes.

In FIG. 2, an AM path of the receiver is shown. As seen, an incoming RF signal is provided to a front end circuit 205 that in turn couples to an LNA 210. From LNA 210, the signal is directly provided to multiple variable gain amplifiers 215. After gain control in VGAs 215, these conditioned signals are provided to corresponding ADCs $220_I$ and $220_Q$, each of which is a controllable ADC configured to operate in one of multiple modes, depending on a frequency band of a desired channel. After digitization in ADCs 220, the digitized signals are provided to a DSP 230 for further processing.

ADCs 220 may be configured, e.g., under control of a controller of the receiver, such as control logic of a microcontroller unit (MCU), DSP or other logic to operate in a selected mode depending on the frequency of the desired signal channel. Referring now to Table 1, shown is an example breakdown of the multiple frequency ranges for an AM signal and the corresponding mode in which the ADC can be set. Of course the values can be set differently in a given implementation and Table 1 is for example purposes only.

TABLE 1

| Input Signal Frequency | ADC Mode |
|---|---|
| 500 kHz-800 kHz | Low pass |
| 800 kHz-1100 kHz | Bandpass I |
| 1100 kHz-1400 kHz | Bandpass II |
| 1400 kHz-1710 kHz | Bandpass III |

Note that within these different ADC modes for an AM mode of operation, the clock rate of the ADC does not change. With reference back to FIG. 2, note that control signals CTL1 and CTL2 provided to ADCs $220_I$ and $220_Q$ may be used to control the bandwidth of the ADC and can be based on the frequency of the desired channel. In turn DSP 230 that receives the digitized signals from ADCs $220_I$ and $220_Q$ may function as a low pass filter for the digitized signals.

Embodiments create two independent ADC channels as there is no complex mixing being performed in a mixer for this AM mode. As such, each of these ADCs can be independently configured to digitize two different desired channels with the same RF signal, or to digitize one desired channel and digitize information regarding another portion of the AM band in the RF signal. The information received from the different ADCs may be independently received and handled in the DSP. As an example, while the DSP performs demodulation operations on first information received from a first ADC, the DSP also can perform a background scan function on second information received from a second ADC, e.g., to scan for the presence of one or more other channels in a different portion of the AM spectrum. By repurposing the second unused ADC and implementing a background scan with this ADC, the need for another background tuner to interface with an antenna can be avoided, which may reduce complexity as interfacing multiple tuners to an antenna can be difficult.

By removing a mixer from the architecture of this AM signal path, a simpler low power lower noise receiver is realized. Furthermore, improved RF performance is realized, especially in the presence of blockers at an image frequency and odd harmonics of an oscillator frequency that otherwise would be present in an architecture including a mixer for downconversion of AM signals.

Thus ADC 220 may be used in AM mode and also in FM/DAB mode by controlling its bandwidth for the desired channel. In this way, the costs of area and power penalty are avoided by not converting the entire AM band. Even better, only a single one of the ADCs is used per desired AM channel as a mixer-less solution is provided. Thus ADCs $220_I$ and $220_Q$ may further be reused in other bands. For example, in a FM mode the ADCs may be configured as low pass ADCs (in a low pass mode) operating at a bandwidth of 400 kHz, and in a FM-HD/DAB mode the ADCs may be configured as low pass ADCs (in a low pass mode) operating at a bandwidth of 800 kHz. And in these FM/FM-HD/DAB modes the ADCs may form a complex digitizer.

Figure 3:
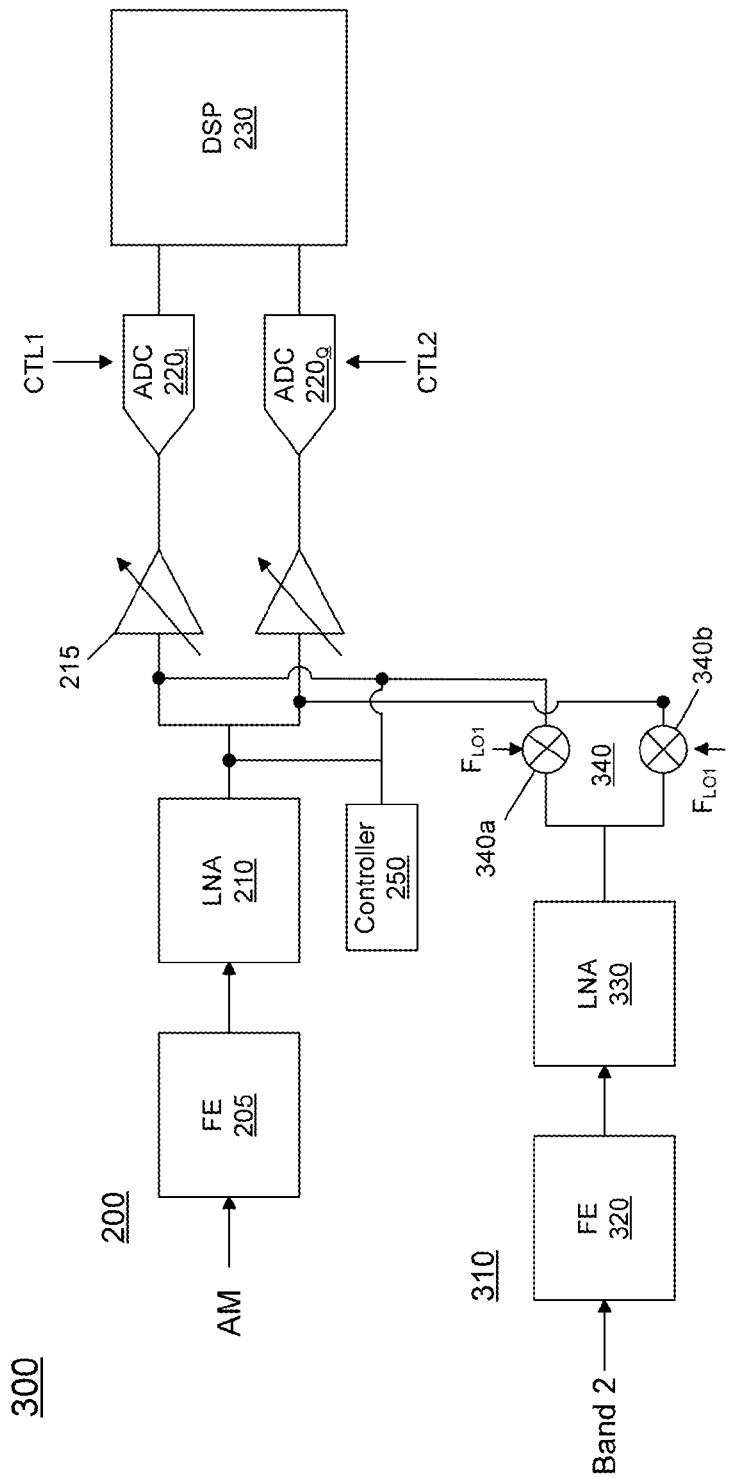
FIG. 3 is a block diagram of further details of a receiver in accordance with an embodiment.

Referring now to FIG. 3, shown is a block diagram of further details of a receiver in accordance with an embodiment. As shown in FIG. 3, receiver 300 includes multiple signal paths, including signal path 200 which as discussed above is an AM signal path. In addition, a second signal path 310 includes front end components for receiving and processing RF signals of another band, e.g., an FM band and/or an FM-HD/DAB band. Specifically as shown in FIG. 3, front end circuitry 320 may include attenuators, filters and so forth. In turn, front end circuitry 320 is coupled to an LNA 330 that in turn provides an amplified RF signal to a complex mixer 340 formed of quadrature clocked real mixers $340_a$ and $340_b$. The downconverted signals, which may be at a given IF frequency, are in turn coupled to the AM path for further processing, including gain control in VGAs 215 and digitization of the in-phase and quadrature phase portions of the downconverted signals in ADCs $220_I$ and $220_Q$.

Thus in the implementation shown in FIG. 3 FM path 310 may reuse the post-downconversion components from the AM path. Of course understand that while drawn in this manner in FIG. 3 other implementations are possible such as providing signals from an LNA of an AM path to IF circuitry, namely PGAs and ADCs, of an FM path. Or more generally, common or shared backend processing circuitry may be configured to receive incoming signals from a selected one of multiple front end signal processing paths, e.g., via selective control of switches controlled, e.g., by a controller 250 (which may be implemented as a MCU) based upon a band of a desired channel.

Figure 4:
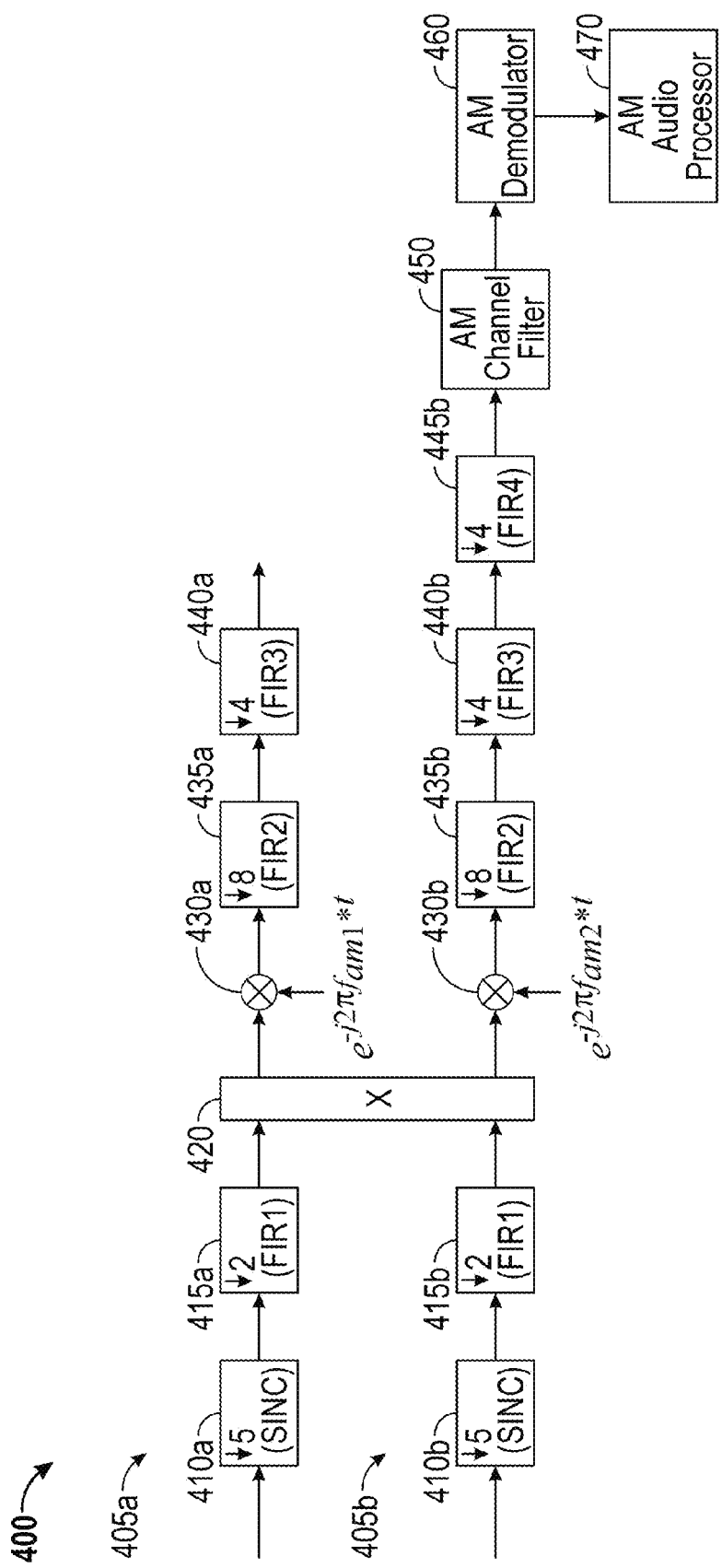
FIG. 4 is a block diagram of a portion of a digital signal processor (DSP) in accordance with an embodiment.

To effect concurrent processing of independent AM channels within a receiver using an embodiment, the DSP can be configured with disparate signal paths for handling the different channels. Referring now to FIG. 4, shown is a block diagram of a portion of a DSP in accordance with an embodiment. As shown in FIG. 4, a circuit 400 is a portion of receiver circuitry including DSP circuitry as well as certain digital hardware at a front end of the DSP. Because different types of processing are to be performed on these different channels, the different signal paths can have different characteristics. In the embodiment shown, circuit 400 includes a first signal path $405_a$ (also referred to as a background path) and a second signal path $405_b$ (also referred to as a primary path). In general, first signal path $405_a$ is configured to receive incoming signals from a first ADC (which may be referred to as an I-channel ADC), while second signal path $405_b$ is configured to receive incoming signals from a second ADC (referred to as a Q-channel ADC). However, note that the enumeration as I and Q ADCs does not indicate separate in-phase and quadrature portions of a complex signal, as instead it is the RF AM signal itself that is provided to these independent paths.

With reference now to digital hardware at a front end of the DSP, incoming RF signals of an AM band can be independently provided to front end digital hardware including a decimator $410_a$ and a finite impulse response (FIR) filter $415_a$, which may perform further decimation. In an embodiment, an incoming RF signal is received in first signal path $405_a$ at a rate of 60 mega samples per second (MS/s) and is decimated by 5 in decimator 410 and further decimated by 2 in filter $415_a$ to thus output the RF signal at a sampling rate of approximately 6 MS/s. In an embodiment, a similar decimator $410_b$ and filter $415_b$ are present for second signal path $405_b$.

As further seen in FIG. 4, the incoming signals output by filters 415 are provided to a multiplexer 420, which may be controlled based at least in part on a mode of operation to select the appropriate signals for providing to the given paths. For example, in some embodiments the output of a single filter 415 may be provided to both signals paths for further processing. In this way, a desired channel can be fully processed and demodulated in second signal path $405_b$ to output audio data, while other processing may be performed on this same signal in first signal path $405_a$ to perform a scan or other background operation. And it is equally possible for a different portion of the AM band to be provided to the different signal paths. For example, when a desired channel is in a low portion of the AM band, it may be provided directly through signal path $405_b$ for further processing in this signal path, while instead a different portion of the AM band may be further processed in signal path $405_a$ to perform background operations.

With further reference to FIG. 4, the signals output by multiplexer 420 are coupled to corresponding complex mixers $430_a$ and $430_b$, which are configured to receive independent real-valued signals and downconvert the RF signals to baseband to thus generate complex baseband outputs. For purposes of background path $405_a$, the additional processing may include further filtering in filters $435_a$ and $440_a$, each of which may be configured as additional FIR filters. In an embodiment, both of these filters may further perform decimation such that a resulting processed signal can be used for purposes of adjacent channel scanning and/or signal measurements such as RSSI/SNR estimates. In one such example, filter $435_a$ decimates the signal by 8 while filter $440_a$ decimates the signal by 4 to thus realize a processed output signal having a sampling rate of approximately 187.5 kilosamples per seconds (kS/s).

This information from background path $405_a$ may be used for various operations, including building a table identifying presence of valid radio signals within the AM band. Furthermore, an indication of the strength of such signals may be obtained and stored in the table. This information may be used, e.g., by AGC algorithms, to aid in processing signals in the presence of strong interferers.

With reference to second signal processing path $405_b$, similar filters $435_b$ and $440_b$ are present. However in other embodiments these filters may have different characteristics and decimation values. Additional processing is performed in this path including further filtering by a filter $445_b$, which may perform further decimation, e.g., by 4, to thus realize a signal having a sampling rate of approximately 46.85 kS/s.

After such decimation/filtering, the resulting signal is provided to an AM channel filter 450 for channel filtering to thus filter the signal to a desired bandwidth, e.g., of approximately 10 kHz. Thereafter, demodulation is performed in a demodulator 460 and further audio processing on the demodulated signal is performed in an audio processor 470, resulting in a digitally demodulated signal, which can then be provided to a digital-to-analog converter (DAC) to thus output analog audio to a desired output source.

Note that depending on the mode of operation one or both of these independent signal paths may be powered down for purposes of reducing power consumption.

Various ADC designs may be used as the programmable ADC in different types of radio receivers. As one such example, a delta-sigma ADC may be implemented such as a fourth order delta-sigma converter. In one particular example, an N-bit fourth order delta-sigma ADC may be implemented. To appropriately control the controllable ADC to operate at a desired bandwidth, a DSP or other controller may send control signals to the ADC to selectively enable the ADC for a given band of operation. For example, the DSP may provide control signals to control a value of a feedback resistance of the ADC.

Figure 5:
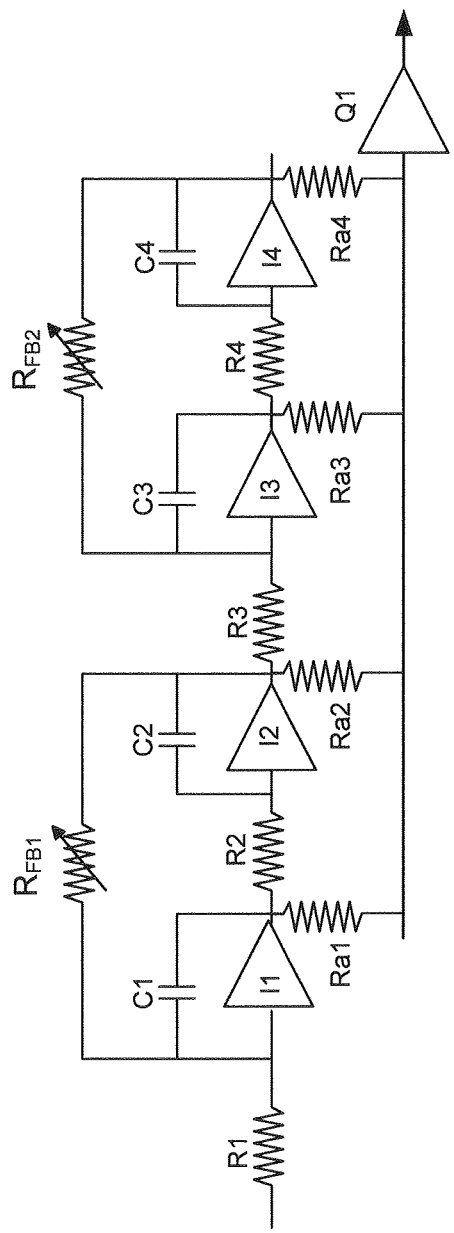
FIG. 5 is a schematic diagram of an analog-to-digital converter (ADC) in accordance with an embodiment.

Referring now to FIG. 5, shown is a schematic diagram of an ADC in accordance with an embodiment. As shown in FIG. 5, a fourth order DS ADC is illustrated. As seen, an input to the ADC couples through a resistor R1 to a series of integrators I1-I4, each of which has a capacitor C1-C4 coupled in feedback between its output and input. In addition, a feedback resistance is coupled in cascade between each of two pairs of the integrators. More specifically, a feedback resistor $R_{FB1}$ is coupled between an output of integrator I2 and an input of I1 and in turn a feedback resistor $R_{FB2}$ is coupled between an output of integrator I4 and an input of I3. In an embodiment, these feedback resistors are variable resistances which may be implemented using a plurality of MOSFET switches, where the impedance of the switch is small relative to the resistor it is switching. In turn, each of the integrator outputs is coupled through a corresponding summation resistor $R_{a1}$-$R_{a4}$ to a quantizer Q1 for output as a digital signal. Note that the bandwidth of the ADC can be controlled by varying these feedback resistance values. More specifically by controlling these values, zeros and noise transfer functions may be programmably controlled.

Figure 6:
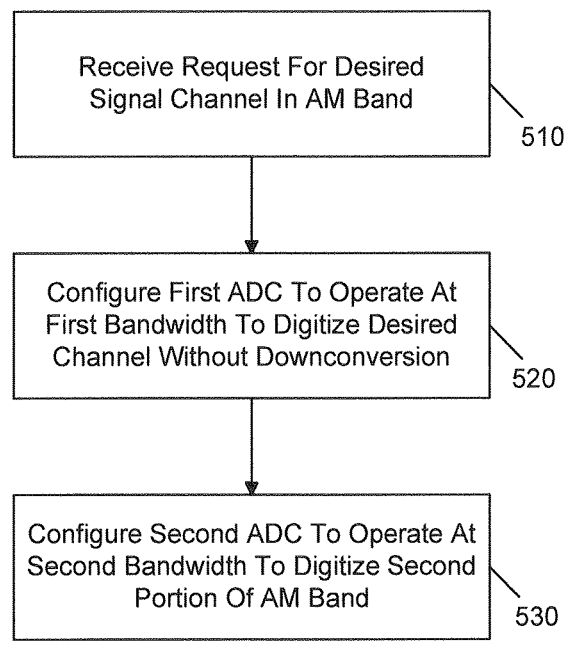
FIG. 6 is a flow diagram of a method for dynamically configuring a radio receiver in accordance with an embodiment.

Referring now to FIG. 6, shown is a flow diagram of a method for dynamically configuring a radio receiver in accordance with an embodiment. In the embodiment shown in FIG. 6, method 500 may be performed by control logic such as of a MCU or DSP to enable a programmable ADC to be set at an appropriate bandwidth for digitizing signals of a portion of an AM band that includes a desired signal channel. As seen, method 500 begins at block 510 by receiving a request for a desired signal channel in the AM band. In an embodiment, this request may be received in the control logic via a user selection of a desired signal channel. Using the received channel request, which in an embodiment may correspond to a given frequency of the desired signal channel, the control logic may access a table such as a lookup table to determine the appropriate ADC setting for the portion of the AM band including the desired signal channel. As one example, the table may include entries such as shown in Table 1 above.

Control next passes to block 520 where a first ADC may be configured to operate at a first bandwidth to enable it to digitize the desired channel without first having the incoming RF signal downconverted to a lower frequency signal. In an embodiment, the control logic may send one or more control signals to the programmable ADC to cause the ADC to be set at the appropriate bandwidth and other parameters. For example with reference back to FIG. 5, such control signals may be used to set a value of the feedback resistors.

In some embodiments, method 500 may conclude at this point as the ADC that is to handle the desired signal channel is appropriately configured. However, in other embodiments additional configuration may occur to enable the receiver to perform scan operations using the second ADC. Thus as seen in FIG. 6, control may optionally continue to block 530 where the second ADC may be configured to operate at a second bandwidth. More specifically, this bandwidth may be at a second, different portion of the AM band and may correspond to a portion of the AM band to be scanned to determine the presence of valid signal channels. For example, in a radio receiver configured for use in an automobile stereo system, as the receiver is operated it may periodically scan the radio environment to determine the availability of additional valid signal channels and store information regarding such valid signal channels in a storage of the receiver such as a table that includes entries each to store information regarding a valid signal channel, such as its frequency and possibly other information. Or this second ADC may be used to digitize information of a second desired channel, e.g., for demodulation and storage for later playback.

Figure 7:
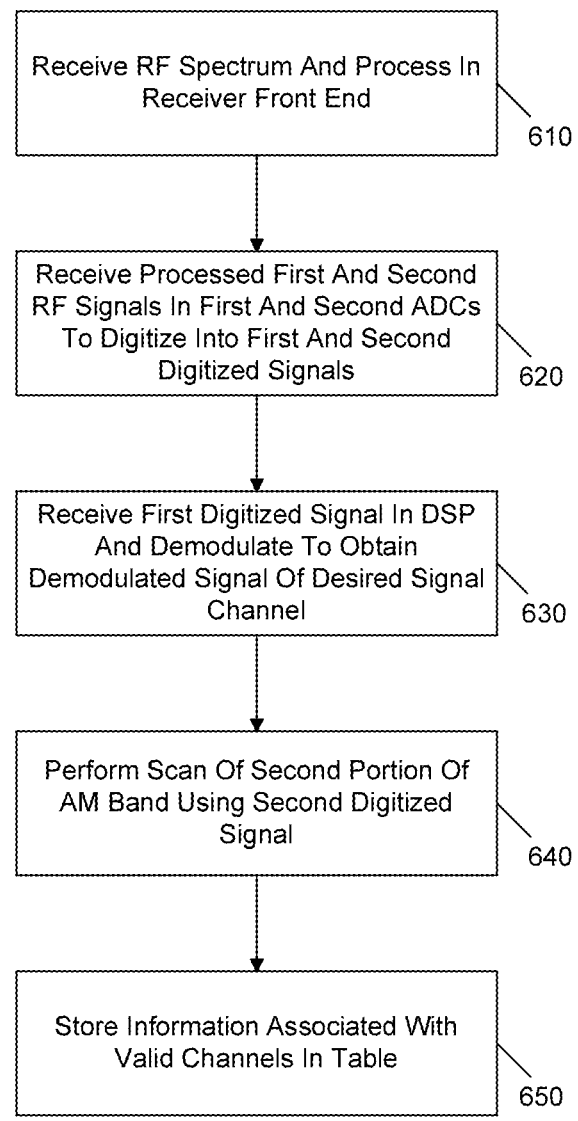
FIG. 7 is a flow diagram of a method for operating a radio receiver in accordance with an embodiment.

Referring now to FIG. 7, shown is a flow diagram of a method for operating a radio receiver in accordance with an embodiment. In the embodiment of FIG. 7, method 600 may be performed by various elements of one or more signal processing paths of the radio receiver. As seen, method 600 begins by receiving an RF spectrum and processing it in a front end of the receiver (block 610). For example, the RF spectrum may be received in the radio receiver via an antenna and various processing such as attenuation, filtering and so forth may be performed to obtain first and second RF signals. In addition, the signal may be amplified in a LNA of the receiver. Additional processing such as gain control in a VGA among other processing also may occur.

Still referring to FIG. 7, control next passes to block 620 where the processed RF signals may be received in multiple ADCs. For example with reference back to FIG. 2, the RF signals as processed may be provided to ADCs 220$_I$ and 220$_Q$. Assume in this embodiment that ADC 220$_I$ is configured for a bandwidth appropriate for digitizing the portion of the AM band including the desired signal channel while ADC 220$_Q$ is programmed for a bandwidth to digitize information in a different portion of the AM band. Accordingly, both ADCs may operate to digitize the corresponding RF signal for given portions of the AM band.

Control next passes to block 630 where a first digitized signal is received in the DSP (from the first ADC). This signal may be demodulated to obtain a demodulated signal corresponding to the desired signal channel. Thereafter additional processing of this demodulated signal can occur such as a conversion back to an analog signal so that it can be output via an appropriate output mechanism such as a speaker.

In an embodiment in which the second ADC is configured for scanning operations, control may optionally pass to block 640 where the DSP may perform a scan on the second portion of the AM band using the second digitized signal. As an example, when a DSP detects signals of a given level (e.g., above a given signal-to-noise ratio) or in another manner, control may pass to block 650 where information associated with such valid channel may be stored in a table. Note that the scan operations may be performed only periodically to reduce power consumption. Furthermore, during the course of such scan operations the second ADC may be dynamically programmed to operate at different bandwidths and other parameters to enable the DSP to scan the full AM band during a given time duration. Or in other embodiments this scan function may not be enabled, e.g., for reasons of power consumption or in the case of implementation of a radio receiver in a stationary audio system. Although shown at this high level in the embodiment of FIG. 7, understand that various alternatives are possible.

Figure 8:
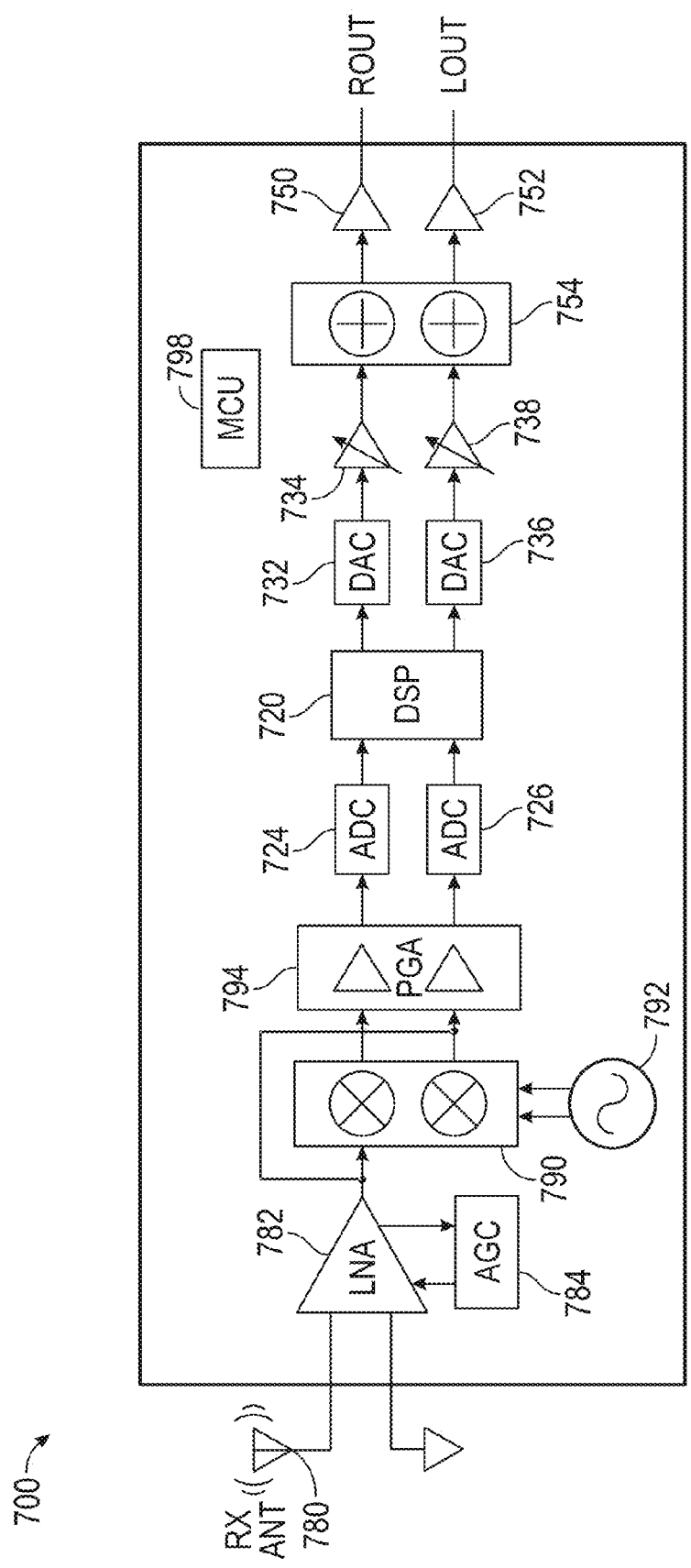
FIG. 8 is a block diagram of a multi-band receiver system in accordance with an embodiment.

Embodiments may be implemented in many different receivers, transceivers and so forth. In some implementations, a radio receiver capable of both AM and FM receive modes, among others, may implement embodiments. Referring now to FIG. 8, shown is a block diagram of a multi-band receiver system 700 in accordance with an embodiment. In one embodiment, system 700 may be a mobile radio such as a car radio. As shown in FIG. 8, a multimode combined AM/FM/WB receiver 700 may be fabricated on a monolithic semiconductor die.

An incoming RF signal is received from an external receive antenna 780 through a LNA 782 controlled by an automatic gain control (AGC) circuit 784. After processing, left channel (called "LOUT") and right channel (called "ROUT") analog stereo signals appear at output terminals 752 and 750, respectively.

The multimode receiver 700 includes analog mixers 790 that are coupled to a tunable local oscillator 792, the frequency of which selects the desired radio channel to which the receiver 700 is tuned. In response to the incoming RF signal, the mixers 790 produce corresponding analog IF, quadrature signals that pass through PGAs 794 before being routed to the ADCs 724 and 726. Note that for an AM mode, the RF signals output from LNA 782 may bypass mixers 790 and be directly provided to PGAs 794. Thus, the ADCs 724 and 726 convert the analog IF quadrature signals from the PGAs 794 into digital signals, which are provided to a DSP 720. ADCs 724 and 726 may be programmably controlled to operate at independent bandwidths as described herein.

The DSP 720 demodulates the received complex signals and processes them as described above to provide corresponding digital left and right channel stereo signals at its output terminals; and these digital stereo signals are converted into analog counterparts by DACs 732 and 736, respectively, which are coupled to programmable gain amplifiers 734 and 738. After mixing or analog adding in adder 754, ROUT and LOUT stereo signals are output at output terminals 750 and 752. A microcontroller unit (MCU) 798 may perform control operations for setting a mode of operation and control of controllable features of the receiver, such as the control of mixer bypassing and ADC configuration described above.

Figure 9:
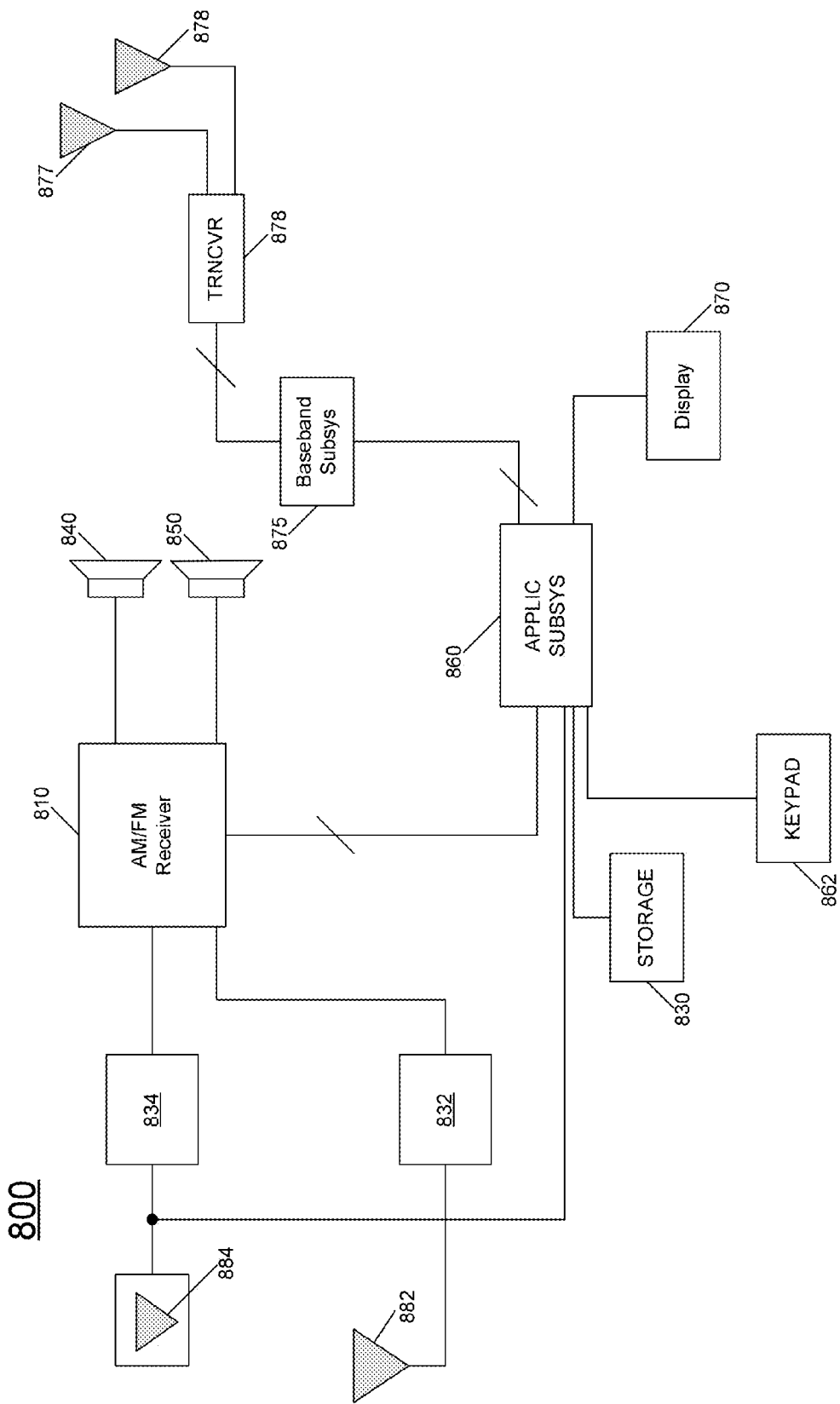
FIG. 9 is a block diagram of a system in accordance with one embodiment.

Referring to FIG. 9, in accordance with some embodiments, an AM/FM receiver 810 (such as an implementation of that shown in the embodiment of FIG. 5) may be part of a multimedia device 800. As examples, the device 800 may be an automobile entertainment system, a portable wireless device such as a dedicated MP3 player, a cellular telephone or PDA with audio capabilities, or other such devices.

Among its other functions, the device 800 may store digital content on a storage 830, which may be a flash memory, hard disk drive, or an external device such as a portable media player, as a few examples. The device 800 generally includes an application subsystem 860 that may, for example, receive input from a keypad 862 of the device 800 and display information on a display 870. Furthermore, the application subsystem 860 may generally control the retrieval and storage of content from the storage 830 and the communication of, e.g., audio with the AM/FM receiver 810. As shown, AM/FM receiver 810 may be directly connected to speakers 840 and 850 for output of audio data. As depicted in FIG. 9, the AM/FM receiver 810 may be coupled by a matching network 832 to an FM receiver antenna 882 and may be coupled by a matching network 834 to an AM receiver antenna 884, which can be tunable or programmable, e.g., via application subsystem 860 that provides control information to control matching network 834.

In accordance with some embodiments, device 800 may also have the ability to communicate over a communications network, such as a cellular network. For these embodiments, the device 800 may include a baseband subsystem 875 that is coupled to the application subsystem 860 for purposes of encoding and decoding baseband signals for this wireless network. Baseband subsystem 875 may be coupled to a transceiver 876 that is connected to corresponding transmit and receive antennas 877 and 878.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first signal path to receive and process a radio frequency (RF) signal of a first band and including a first programmable digitizer to convert the RF signal of the first band into a first digitized signal without downconversion to a lower frequency signal and a second programmable digitizer to convert a second RF signal of the first band into a second digitized signal without downconversion to a lower frequency signal.

2. The apparatus of claim 1, further comprising a second signal path to receive and process a RF signal of a second band and including a complex mixer to downconvert the RF signal of the second band to a second frequency signal, wherein the second signal path is to reuse the first and second programmable digitizers as a complex digitizer to digitize the second frequency signal into a third digitized signal.

3. The apparatus of claim 2, wherein the first signal path further comprises a first front end circuit, a first low noise amplifier (LNA), and first and second variable gain amplifiers (VGAs), wherein an output of the first VGA is coupled to the first programmable digitizer and an output of the second VGA is coupled to the second programmable digitizer.

4. The apparatus of claim 3, wherein the second signal path further comprises a second front end circuit and a second LNA having an output coupled to the complex mixer of the second signal path, wherein an output of the complex mixer is coupled to the first and second VGAs.

5. The apparatus of claim 2, wherein the complex mixer of the second signal path is disabled when a desired signal channel is within the first band.

6. The apparatus of claim 1, further comprising a digital signal processor (DSP) coupled to the first and second programmable digitizers to receive and process the first and second digitized signals.

7. The apparatus of claim 6, wherein the DSP is to demodulate the first digitized signal to output a demodulated signal corresponding to a desired signal channel and to scan the second digitized signal for one or more valid channels and to populate a table with the one or more valid channels.

8. The apparatus of claim 7, wherein the DSP includes a selector to receive the first digitized signal and the second digitized signal and to provide the second digitized signal to a first digital signal path including at least one filter and to provide the first digitized signal to a second digital signal path including at least one filter, a demodulator, and an audio processor.

9. A radio receiver comprising:
a first signal path to receive and process a radio frequency (RF) signal of an AM band and including:
a first branch having a first digitizer controllable to digitize a first portion of the AM band of the RF signal including a desired signal channel; and
a second branch having a second digitizer controllable to digitize another portion of the AM band of the RF signal while the first digitizer digitizes the first portion of the AM band; and
a second signal path to receive and process a RF signal of an FM band and including a complex mixer to downconvert the RF signal of the FM band to a second frequency signal, wherein the second signal path is to provide the second frequency signal to the first and second digitizers to digitize the second frequency signal.

10. The radio receiver of claim 9, wherein the first signal path further includes a first front end circuit and a first low noise amplifier (LNA), and the first branch further includes a first variable gain amplifier (VGA) and the second branch further includes a second VGA.

11. The radio receiver of claim 10, wherein the second signal path further includes a second front end circuit and a second LNA, wherein an output of the second LNA is coupled to the complex mixer.

12. The radio receiver of claim 9, wherein the first digitizer is controllable to operate as a low pass analog-to-digital converter (ADC) when the desired signal channel is within the first portion of the AM band and controllable to operate as a bandpass ADC when the desired channel is within a second portion of the AM band, the second AM band portion of a higher frequency than the first portion of the AM band.

13. The radio receiver of claim 9, wherein the first digitizer is controllable to operate at a first bandwidth to digitize the desired signal channel located in the first portion of the AM band and the second digitizer is concurrently controllable to operate at a second bandwidth to digitize a second signal channel located in the another portion of the AM band.

14. The radio receiver of claim 13, further comprising a controller to configure the first and second digitizers to operate at the first and second bandwidths, respectively, in an AM mode, and to configure each of the first and second digitizers to operate at a third bandwidth in an FM mode.

15. The radio receiver of claim 9, wherein the first and second digitizers are controllable to operate at a low pass mode to digitize a complex intermediate frequency (IF) signal in an FM mode.

16. A method comprising:
receiving a request for a desired signal channel in a first band in a controller of a radio receiver; and
configuring a first analog-to-digital converter (ADC) of the radio receiver to operate at a first bandwidth, based on a frequency of the desired signal channel, to digitize the desired signal channel without downconversion to a lower frequency signal.

17. The method of claim 16, further comprising configuring a second ADC of the radio receiver to operate at second bandwidth to digitize a second portion of the first band without downconversion.

18. The method of claim 17, further comprising receiving a first radio frequency (RF) signal in the first ADC and receiving a second RF signal in the second ADC and digitizing the first RF signal into a first digitized signal in the first ADC and digitizing the second RF signal into a second digitized signal in the second ADC.

19. The method of claim 18, further comprising receiving the first digitized signal in a digital signal processor (DSP) of the radio receiver and demodulating the first digitized signal to obtain a demodulated signal for the desired signal channel.

20. The method of claim 18, further comprising:
performing a scan of at least a portion of the first band using the second digitized signal to determine presence of one or more valid channels in the second portion of the first band; and storing information associated with the one or more valid channels in a table of the radio receiver, wherein the first band is an AM band.

* * * * *